(12) United States Patent
Grolman et al.

(10) Patent No.: US 11,906,756 B2
(45) Date of Patent: Feb. 20, 2024

(54) OPTICAL ASSEMBLIES FOR AIRCRAFT DISPLAYS

(71) Applicant: GOODRICH CORPORATION, Charlotte, NC (US)

(72) Inventors: Danielle L. Grolman, East Hartford, CT (US); Jose-Rodrigo Castillo-Garza, East Hartford, CT (US); Dustin D. Caldwell, Portland, CT (US); Brigid A. Blakeslee, East Hartford, CT (US)

(73) Assignee: GOODRICH CORPORATION, Charlotte, NC (US)

( * ) Notice: Subject to any disclaimer, the term of this patent is extended or adjusted under 35 U.S.C. 154(b) by 180 days.

(21) Appl. No.: 17/470,941

(22) Filed: Sep. 9, 2021

(65) Prior Publication Data

US 2023/0075171 A1 Mar. 9, 2023

(51) Int. Cl.
*G09G 3/32* (2016.01)
*G02B 3/00* (2006.01)
*B60Q 3/47* (2017.01)
*B60Q 3/43* (2017.01)
*G02B 5/02* (2006.01)
(Continued)

(52) U.S. Cl.
CPC ............ *G02B 3/0037* (2013.01); *B60Q 3/43* (2017.02); *B60Q 3/47* (2017.02); *G02B 5/021* (2013.01); *G02B 5/0268* (2013.01); *G06T 7/0002* (2013.01); *G09G 3/32* (2013.01); *H01L 25/0753* (2013.01); *H01L 25/167* (2013.01); *H01L 33/58* (2013.01); *G06T 2207/30168* (2013.01); *G09G 2320/066* (2013.01); *G09G 2320/0626* (2013.01); *G09G 2340/0407* (2013.01);
(Continued)

(58) Field of Classification Search
CPC .... G02B 3/0037; G02B 5/021; G02B 5/0268; G02B 5/0263; G02B 19/0014; G02B 19/0066; B60Q 3/43; B60Q 3/47; G06T 7/0002; G06T 2207/30168; G09G 3/32; G09G 2320/0626; G09G 2320/066; G09G 2340/0407; G09G 2380/12; H01L 25/0753; H01L 25/167; H01L 33/58; H01L 2933/0058; H01L 2933/0091; H10K 59/879
See application file for complete search history.

(56) References Cited

U.S. PATENT DOCUMENTS 6,846,099 B2 * 1/2005 Dubin .................... H05B 45/10
362/245
8,192,028 B2 6/2012 Heym et al.
(Continued)

FOREIGN PATENT DOCUMENTS

CN 110534664 12/2019

OTHER PUBLICATIONS

European Patent Office, European Search Report dated Feb. 3, 2023 in Application No. 22194691.6.

*Primary Examiner* — Vijay Shankar
(74) *Attorney, Agent, or Firm* — SNELL & WILMER L.L.P.

(57) ABSTRACT

A light emitting diode display panel may comprise a substrate, a plurality of light emitting diodes located over the substrate, and an optical assembly located over the plurality of light emitting diodes. The optical assembly may include a lens array and a diffuser. An inner surface of the lens array may define a plurality of inner curves.

19 Claims, 6 Drawing Sheets

(51) Int. Cl.
  *G06T 7/00* (2017.01)
  *H01L 25/075* (2006.01)
  *H01L 25/16* (2023.01)
  *H01L 33/58* (2010.01)

(52) U.S. Cl.
  CPC .. *G09G 2380/12* (2013.01); *H01L 2933/0058* (2013.01); *H01L 2933/0091* (2013.01)

(56) References Cited

U.S. PATENT DOCUMENTS

| | | | |
|---|---|---|---|
| 9,062,854 B2* | 6/2015 | Livesay | H01L 33/641 |
| 9,169,017 B2* | 10/2015 | Palagashvili | F21V 5/004 |
| 10,288,884 B1 | 5/2019 | Gollier et al. | |
| 10,427,599 B2* | 10/2019 | Di Trapani | B60Q 3/745 |
| 10,649,275 B1 | 5/2020 | Johnson et al. | |
| 10,775,662 B2 | 9/2020 | Johnson | |
| 2002/0196637 A1* | 12/2002 | Dubin | B64D 47/06 |
| | | | 362/540 |
| 2010/0339797 | 2/2010 | Shinkai et al. | |
| 2015/0362637 A1 | 12/2015 | Kawata | |
| 2016/0327234 A1 | 11/2016 | Hu et al. | |
| 2021/0211618 A1 | 7/2021 | Silverstein et al. | |

* cited by examiner

OPTICAL ASSEMBLIES FOR AIRCRAFT DISPLAYS

FIELD

The present disclosure relates generally to optical assemblies and, more particularly, to optical assemblies for aircraft cabin display panels.

BACKGROUND

In modern aircraft, light emitting diode (LED) display panels may be located throughout the aircraft cabin. For example, LED display panels may be located on the seat backs, overhead bins, cabin walls, cabin ceiling, lavatory door, etc. The LED display panels may be used to display flight information, aircraft information, passenger information, advertisements, entertainment, etc. Current LED display panels employ optical diffusers to enhance appearance of the displayed images. The separation (i.e., space) between the optical diffuser and the LEDs increases the thickness of the LED display panels, which tends to limit the versatility of the LED display panels and/or the locations where the LED display panels may be employed. Further, current LED display panels include components such as spacers, mounting fixtures, and structural supports to achieve the spacing between the optical diffuser and the LEDs. These components tend to increase the part count, cost, installation difficulty, installation time, and/or weight associated with the LED display panel.

SUMMARY

A LED display panel is disclosed herein. In accordance with various embodiments, the LED display panel may comprise a substrate, a plurality of LEDs located over the substrate, and an optical assembly located over the plurality of LEDs. The optical assembly may include a lens array and a diffuser.

In various embodiments, an inner surface of the lens array may define a plurality of inner curves. In various embodiments, a geometry of a geometry of a first inner curve of the plurality of inner curves is different from a geometry of a second inner curve of the plurality of inner curves. The first inner curve is located over a first LED of the plurality of LEDs and the second inner curve is located over a second LED of the plurality of LEDs.

In various embodiments, each LED of the plurality of LEDs includes a dedicated inner curve of the plurality of inner curves.

In various embodiments, an outer surface of the lens array defines a plurality of outer curves. In various embodiments, each LED of the plurality of LEDs includes a dedicated outer curve of the plurality of outer curves.

In various embodiments, the diffuser may be integral to the lens array. In various embodiments, a plurality of standoffs may be coupled between the substrate and the lens array.

In various embodiments, at least one of a first surface pattern of a first region of the diffuser, a first thickness of the first region of the diffuser, a first surface coating of the first region of the diffuser, or a first material of the first region of the diffuser is different from at least one of a second surface pattern of a second region of the diffuser, a second thickness of the second region of the diffuser, a second surface coating of the second region of the diffuser, or a second material of the second region of the diffuser.

In various embodiments, the first region of the diffuser is located over a first LED of the plurality of LEDs and the second region of the diffuser is located over a second LED of the plurality of LEDs. The first LED may emit light having a first wavelength, and the second LED may emit light having a second wavelength different from the first wavelength.

In various embodiments, a controller is operably coupled to the plurality of LEDs. The controller may be configured to perform an image quality assessment for a displayed image. In various embodiments, the controller is configured to compare the displayed image to a target image, and adjust at least one of a sharpness, a contrast, or a brightness of the of the LED display panel based on the comparison of the displayed image to the target image.

An aircraft cabin structure is also disclosed herein. In accordance with various embodiments, the aircraft cabin structure may comprise a surface and a LED display panel mounted to the surface. The LED display panel may include a substrate, a plurality of LEDs located over the substrate, and an optical assembly located over the plurality of LEDs. The optical assembly may include a lens array and a diffuser.

In various embodiments, an inner surface of the lens array may define a plurality of inner curves and an outer surface of the lens array may define a plurality of outer curves. In various embodiments, a plurality of standoffs may be coupled between the substrate and the lens array.

A method of making of LED display panel is also disclosed herein. In accordance with various embodiments, the method may comprise the steps of locating a plurality of LEDs over a substrate, forming an optical assembly including a lens array and a diffuser, and coupling the optical assembly over the plurality of LEDs. The lens array defines at least one of a plurality of inner curves or plurality of outer curves.

In various embodiments, forming the optical assembly may comprise determining a design of the lens array and the diffuser based on an image quality assessment. In various embodiments, forming the optical assembly may comprise forming the diffuser integrally with the lens array using at least one of injection molding or additive manufacturing to form the diffuser integrally with the lens array.

In various embodiments, coupling the optical assembly over the plurality of LEDs may comprise locating a plurality of standoffs between the lens array and the substrate.

In various embodiments, forming the optical assembly may comprise at least one of forming a first inner curve of the plurality of inner curves having a first geometry and a second inner curve of the plurality of inner curves having a second geometry, the second geometry being different from the first geometry, wherein the first inner curve is located over a first LED of the plurality of LEDs, and wherein the second inner curve is located over a second LED of the plurality of LED; or forming a first outer curve of the plurality of inner curves having a third geometry and a second outer curve of the plurality of inner curves having a fourth geometry, the third geometry being different from the fourth geometry, wherein the first outer curve is located over the first LED of the plurality of LEDs, and wherein the second outer curve is located over the second LED of the plurality of LEDs; or forming a first region of the diffuser comprising a least one of a first surface pattern, a first material, a first thickness, or a first surface coating, and forming a second region of the diffuser comprising at least one of a second surface pattern, a second material, a second thickness, or a second surface coating, the first surface pattern being different from the second surface pattern, the second material being different from the first material, the second thickness being different from the first thickness, the second surface coating being different from the first surface coating. The first region of the diffuser may be located over a first LED of the plurality of LEDs, and the second region of the diffuser may be located over a second LED of the plurality of LEDs.

The foregoing features and elements may be combined in any combination, without exclusivity, unless expressly indicated herein otherwise. These features and elements as well as the operation of the disclosed embodiments will become more apparent in light of the following description and accompanying drawings.

BRIEF DESCRIPTION OF THE DRAWINGS

The accompanying drawings illustrate various embodiments employing the principles described herein and are a part of the specification. The illustrated embodiments are meant for description and not to limit the scope of the claims.

DETAILED DESCRIPTION

The following detailed description of various embodiments herein makes reference to the accompanying drawings, which show various embodiments by way of illustration. While these various embodiments are described in sufficient detail to enable those skilled in the art to practice the disclosure, it should be understood that other embodiments may be realized and that changes may be made without departing from the scope of the disclosure. Thus, the detailed description herein is presented for purposes of illustration only and not of limitation. Furthermore, any reference to singular includes plural embodiments, and any reference to more than one component or step may include a singular embodiment or step. Also, any reference to attached, fixed, connected, or the like may include permanent, removable, temporary, partial, full or any other possible attachment option. Additionally, any reference to without contact (or similar phrases) may also include reduced contact or minimal contact. It should also be understood that unless specifically stated otherwise, references to "a," "an" or "the" may include one or more than one and that reference to an item in the singular may also include the item in the plural. Further, all ranges may include upper and lower values and all ranges and ratio limits disclosed herein may be combined.

Figure 1:
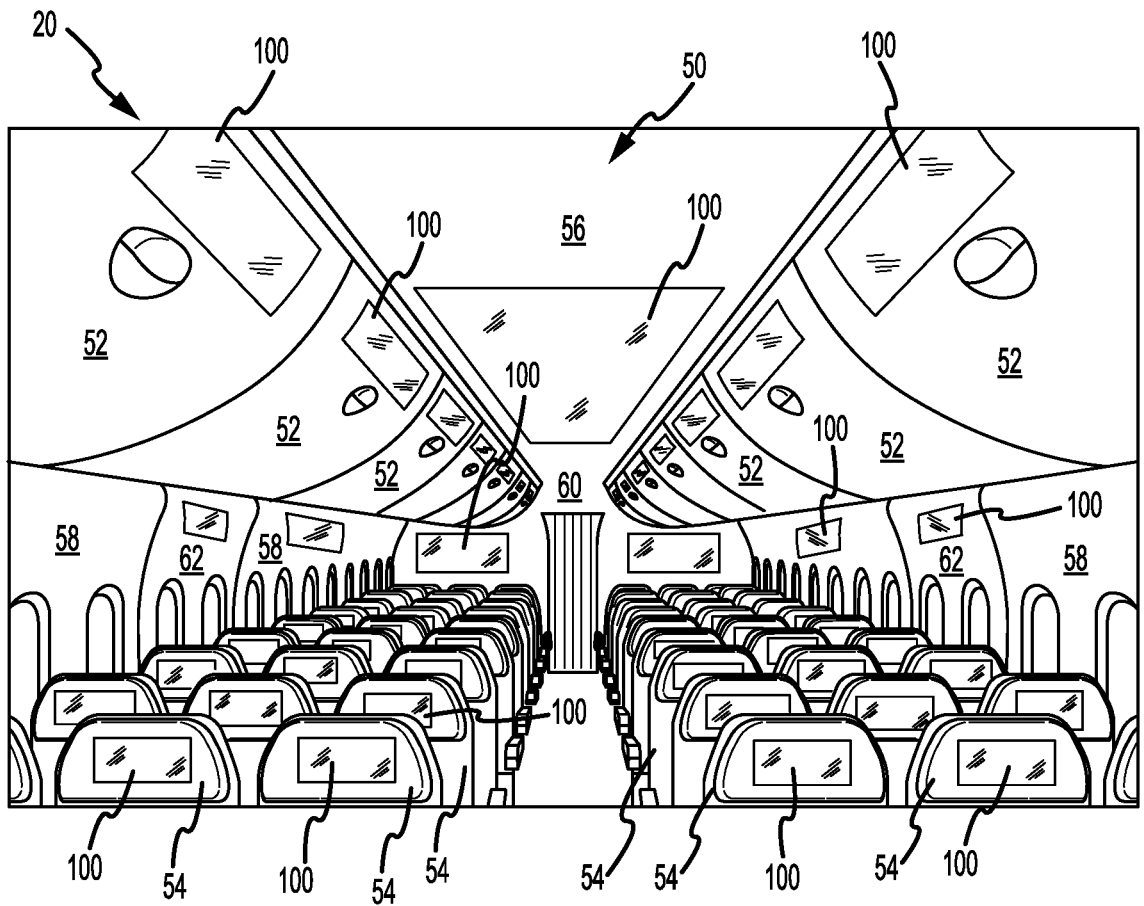
FIG. 1 illustrates LED display panels located throughout a cabin of an aircraft, in accordance with various embodiments.

With reference to FIG. 1, a cabin 50 of an aircraft 20 is shown, according to various embodiments. The aircraft 20 may be any aircraft such as an airplane, a helicopter, or any other aircraft. The aircraft 20 may include various LED display panels 100 configured to display images to persons in cabin 50. For example, LED display panels 100 may be located on and mounted to a surface of overhead bins 52, passenger seats 54, cabin ceiling 56, cabin walls 58, cabin panels 60, exit doors 62, a lavatory door, and/or any other aircraft cabin structure/surface where an LED display panel 100 may be desired. LED display panels 100 may be employed to display flight information (e.g. altitude, maps, flight time remaining, etc.), aircraft information (e.g., current occupancy, lavatory occupancy, emergency exit procedures, emergency exit location, etc.), passenger information (e.g., name, special needs, etc.), advertisements, inflight entertainment, and/or any other desired graphics and/or images.

As described in further detail below, the LED display panels 100 include a plurality of LEDs arranged in an array with an optical assembly located over the LEDs. In accordance with various embodiments, the optical assembly includes a lens array and a diffuser to enhance image appearance while minimizing a thickness of the LED display panels 100. The lens array may be application specific with variations in shape, transmission characteristics, and thickness. In various embodiments, the diffuser may be coupled to the lens array. In various embodiments, the diffuser may be integral to the lens array. In various embodiments, standoffs may be located throughout the LED display panels 100. The standoffs may provide impact protection for the LEDs.

Figure 2A:
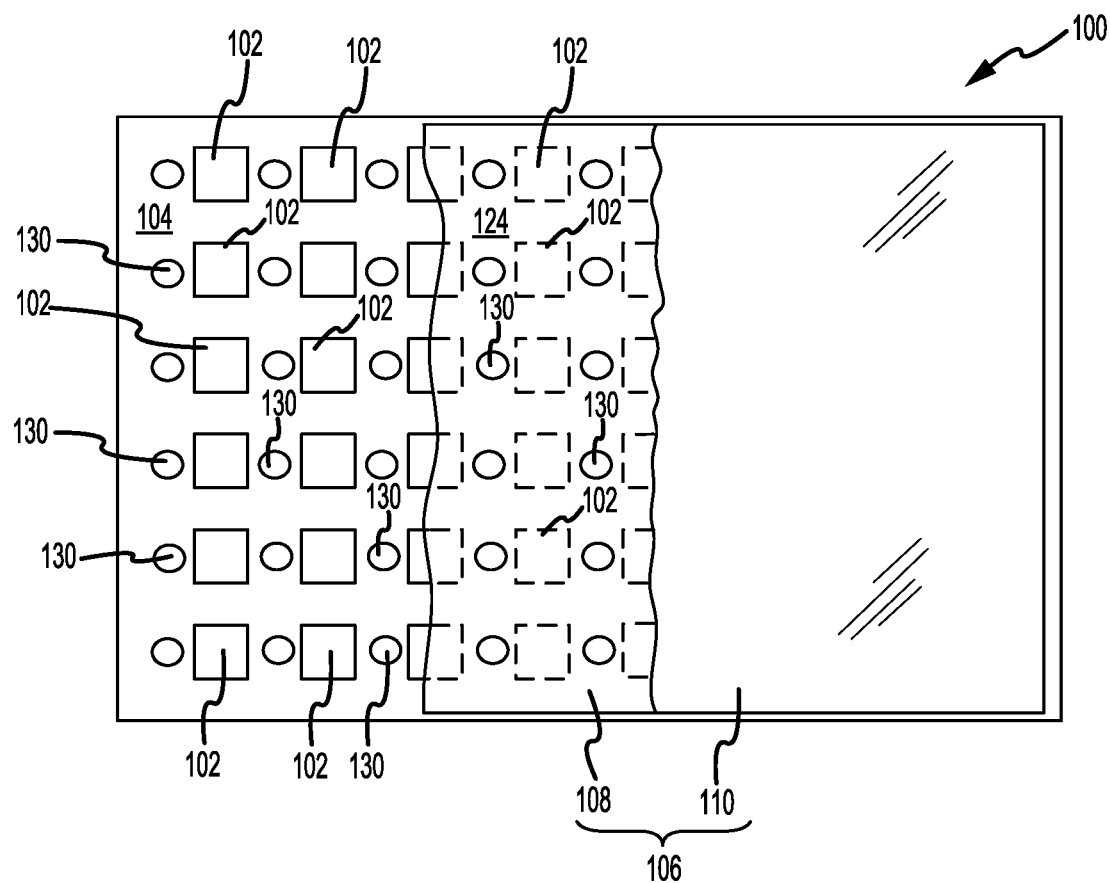
FIG. 2A illustrates an LED display panel, in accordance with various embodiments.
Figure 2B:
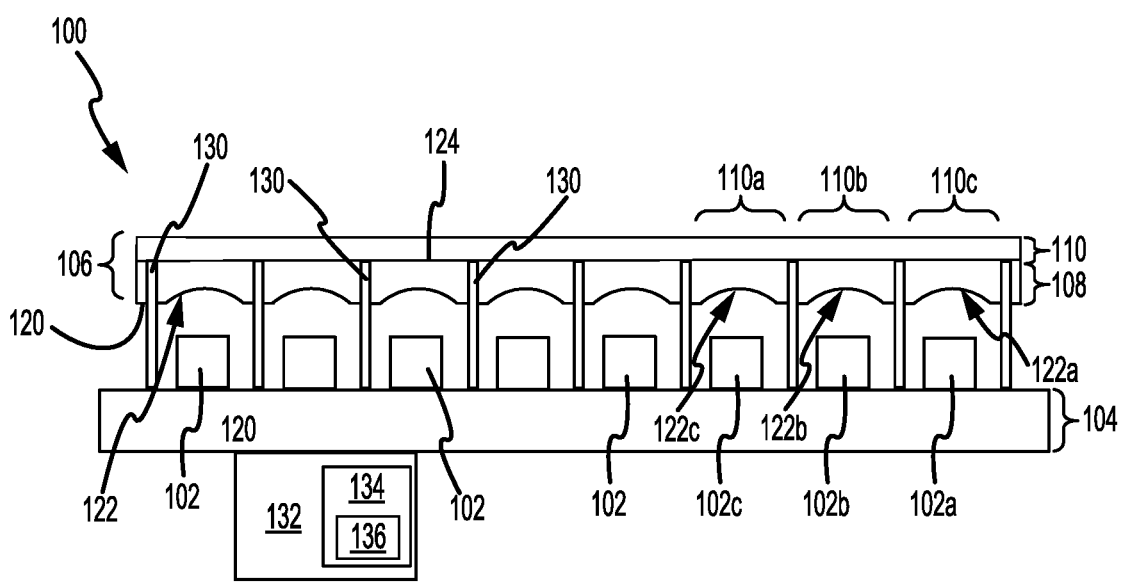
FIG. 2B illustrates a cross-section view of the LED display panel of FIG. 2A, in accordance with various embodiments.

With reference now to FIGS. 2A and 2B, a plan view and a cross-section view of an LED display panel 100 are illustrated, respectively. In accordance with various embodiments, LED display panel 100 includes a plurality of LEDs 102. LEDs 102 are mounted to, and/or arranged in an array over, a substrate 104. In various embodiments, substrate 104 may include a printed circuit board. LEDs 102 comprise various colors, including, for example, red, green, and blue LEDs. Note that while the disclosure is described in general terms using LEDs as the light source of an LED display panel 100, other light sources are contemplated, such as, for example, digital light processing (DLP), liquid crystal display (LCD), liquid crystal on silicon (LCoS), organic LED (OLED) and quantum dot (QD) sources.

An optical assembly 106 is located over the LEDs 102, such that LEDs 102 are located between optical assembly 106 and substrate 104. In various embodiments, LED display panel 100 may have a pixel size of approximately 300 micrometer (μm) by 300 μm and a pixel pitch of 350 μm or greater. Stated differently, LEDs 102 may each be approximately 300 μm by 300 μm and may have a pitch (e.g., a distance between the center points of adjacent LEDs 102) of 350 μm or greater. As used in the previous context only, "approximately" means ±10% of the associated value.

In accordance with various embodiments, the optical assembly 106 includes a lens array 108 and a diffuser 110. In FIG. 2A, a portion of lens array 108 and a portion of diffuser 110 have been cut away to illustrate the LEDs 102. An inner (or first) surface 120 of lens array 108 defines a plurality of optically engineered inner curves 122. Stated differently, inner curves 122 are formed in inner surface 120. Inner surface 120 is oriented toward substrate 104 and LEDs 102. Inner curves 122 are designed (e.g., a shape, radius of curvature, focal length, etc. of each inner curve 122 is selected) based on desired characteristics (e.g., optical aberration, tilt, coma, distortion, etc.) for LED display panel 100. In this regard, the geometry of inner curves 122 is driven by the optical requirements of display panel 100.

In accordance with various embodiments, each LED 102 has a dedicated inner curve 122. For example, a first inner curve 122a is located over and refracts light emitted from a first LED 102a; a second inner curve 122b is located over and refracts light emitted from a second LED 102b; a third inner curve 122c is located over and refracts light emitted from a third LED 102c, etc. In various embodiments, first LED 102a may emit light having a different wavelength from the light emitted from second LED 102b and/or different from the wavelength of the light emitted from third LED 102c, and/or second LED 102b may emit light having a different wavelength from the light emitted from third LED 102c.

In accordance with various embodiments, diffuser 110 is coupled to an outer (or second) surface 124 of lens array 108. Outer surface 124 is opposite inner surface 120 and is oriented away from substrate 104 and LEDs 102. Diffuser 110 is configured to distribute (e.g. scatter) the light exiting outer surface 124 of the lens array 108.

In accordance with various embodiment, a plurality of standoffs 130 is coupled between substrate 104 and optical assembly 106. Standoffs 130 are configured to create and/or maintain a spacing (e.g. a distance) between inner surface 120 of lens array 108 and LEDs 102. The space created between lens array 108 and LEDs 102 by standoffs 130 tends to protect LEDs 102 from impact damage. For example, if a passenger or a piece of luggage impacts diffuser 110, standoffs 130 may prevent lens array 108 from translating toward and/or contacting LEDs 102. In this regard, standoffs 130 tend to decrease occurrences of damage to LEDs 102.

While FIG. 2A illustrates each pair of adjacent LEDs 102 having a standoff 130 located therebetween (i.e., each adjacent pair of standoffs 130 has one LED 102 located therebetween), other standoff 130 locations and patterns are within the scope of this disclosure. For example, additional, or alternative, standoffs 130 may be located catty-corner to LEDs 102. In various embodiments, a standoff 130 may be located at each of the four sides of an LED 102. In various embodiments, two or more LEDs 102 may be located between a pair of adjacent standoffs 130.

While lens array 108 is illustrated as having a plane, flat outer surface 124, in various embodiments, lens array 108 may include outer curves 126 formed in outer surface 124 of lens array 108. For example, and with momentary reference to FIG. 3, in various embodiments, outer surface 124 of lens array 108 defines a plurality of optically engineered outer curves 126. Stated differently, outer curves 126 are formed in outer surface 124. Outer surface 124 is oriented away from substrate 104 and LEDs 102. Outer curves 126 are designed (e.g., a shape, radius of curvature, focal length, etc. of each outer curve 126 is selected) based on desired characteristics (e.g., optical aberration, tilt, coma, distortion, etc.) for display panel 100. In this regard, the geometry of outer curves 126 is driven by the optical requirements of display panel 100.

In accordance with various embodiments, each LED 102 has a dedicated outer curve 126. For example, a first outer curve 126a is located over and refracts light emitted from a first LED 102a; a second outer curve 126b is located over and refracts light emitted from a second LED 102b; a third outer curve 126c is located over and diverges light emitted from a third LED 102c, etc. First outer curve 126a is located over first inner curve 122a. A geometry (e.g., a shape, radius of curvature, focal length, etc.) of first outer curve 126a may be the same or may be different from the geometry (e.g., a shape, radius of curvature, focal length, etc.) of first inner curve 122a. Second outer curve 126b is located over second inner curve 122b. A geometry of second outer curve 126b may be the same or may be different from the geometry of second inner curve 122b. Third outer curve 126c is located over third inner curve 122c. A geometry of third outer curve 126c may be the same or may be different from the geometry of third inner curve 122c. In accordance with various embodiments, the geometry of each inner curve 122 and the geometry of each outer curve 126 may be selected based on the wavelength of light emitted from the LED 102 associated with the inner curve 122 and the outer curve 126 (e.g., based on the wavelength of light emitted from the LED 102 located directly under each inner curve 122 and outer curve 126). The geometry (e.g., a shape, radius of curvature, focal length, etc.) of each outer curve 126 may be the same or may be different from the geometry of the inner curve 122 located directly below the outer curve 126.

Returning to FIG. 2B, in various embodiments, the LED display panel 100 includes a controller 132. Controller 132 is operably coupled to LEDs 102. Stated differently, LEDs 102 may be controlled by controller 132 to generate a desired color of light, including white light. As described in further detail below, controller 132 may perform image pre-processing (e.g., may adjust sharpness, contrast, brightness, etc.) to improve an image quality of images displayed on LED display panel 100. Controller 132 may perform an image quality assessment. In various embodiments, controller 132 may perform a full reference image quality assessment (FR-IQA), and may employ image quality assessment metrics (e.g., Peak Signal-to-Noise Ratio, Mean Squared Error, or Structural Similarity Index Measure) to determine a quality of an image displayed on LED display panel 100. In various embodiments, controller 132 may also, or alternatively, perform a reduced reference image quality assessment and/or a no-reference image quality assessment. Controller 132 may then adjust the intensity and/or power state of various LEDs 102 based on the image quality assessment to improve the quality/appearance of the displayed image.

Controller 132 may include one or more logic devices such as one or more of a central processing unit (CPU), an accelerated processing unit (APU), a digital signal processor (DSP), a field programmable gate array (FPGA), an application specific integrated circuit (ASIC), or the like (e.g., controller 132 may utilize one or more processors of any appropriate type/configuration, may utilize any appropriate processing architecture, or both). A tangible, non-transitory computer-readable storage medium 134 may be in communication with controller 132. The storage medium 134 may comprise any tangible, non-transitory computer-readable storage medium known in the art. The storage medium 134 has instructions stored thereon that, in response to execution by controller 132, cause controller 132 to perform operations related to assessing an image quality of images displayed on LED display panel 100 and/or otherwise controlling LED display panel 100 (e.g., storage medium 134 may store instructions usable by the logic device to perform operations). image quality assessment.

In accordance various embodiments, controller 132 is configured to perform an image quality assessment of the images displayed on display panel 100. Controller 132 may assess a quality of a displayed image by comparing the displayed image to a target image. The target image and/or target image data may be stored in storage medium 134. For example, controller 132 may be configured to access target images and/or target image data, which may be stored in storage medium 134. Controller 132 performs an objective image quality assessment by comparing the displayed image data with the target image data to see how closely the displayed image resembles the appearance of the target image. The controller 132 may calculate an image quality assessment score using, for example, one or more of Peak Signal-to-Noise Ratio (PSNR), Mean Squared Error (MSE), and Structural Similarity Index Measure (SSIM), to determine how closely the displayed image matches the appearance of the target image. The image quality assessment score may be used by controller 132 for processing of an image to improve how the image appears on LED display panel 100. For example, an increase in the image quality assessment score indicates an adjustment to the displayed image has had a positive impact on the appearance and that the displayed image is now more similar to the target image. In this regard, controller 132 may perform the image quality assessment (e.g., a FR-IQA) employing image quality assessment metrics including one or more of PSNR, MSE, SSIM, and/or any other suitable image quality assessment metric. Controller 132 may then, based on the comparison of the displayed image and the target image, adjust one or more image characteristics (e.g., sharpness, contrast, brightness, etc.) of LED display panel 100 to improve a quality and/or appearance of the displayed image.

The target images and/or target image data may be compiled from previously collected subjective data (e.g., subjective data collected from subject image quality assessments), machine learning, or any other suitable data source. The image quality assessment operations may be conducted or enhanced by artificial intelligence (AI) or machine learning. AI may refer generally to the study of agents (e.g., machines, computer-based systems, etc.) that perceive the world around them, form plans, and make decisions to achieve their goals. Foundations of AI may include mathematics, logic, philosophy, probability, linguistics, neuroscience, and decision theory. Many fields fall under the umbrella of AI, such as computer vision, robotics, machine learning, and natural language processing. In various embodiments, as controller 132 accumulates data from image quality assessments, controller 132 may generate image adjustments (e.g., sharpness, contrast, brightness, etc.) of LED display panel 100 based at least in part on historical information from prior image quality assessments stored in storage medium 134. For example, controller 132 may apply machine learning techniques to generate preprocessing metrics for the specific configuration of optical assembly 106. In this regard, controller 132 may learn what corrections need to be made to images for a given display to improve the image quality, and those corrections could be made prior to the image being displayed. In various embodiments, controller 132 may be configured to determine what corrections/image processing steps to take based on the image to be displayed and previous corrections and/or previous image processing data. For example, if controller 132 determines the image to be displayed is a text image, controller 132 makes a set of adjustments to LED display panel 100 (e.g., adjustments to the sharpness, contrast, brightness, etc.) that are specific to text images. Similarly, if controller 132 determines the image to be displayed is, for example, a building or other structure formed substantially by straight, flat lines, controller 132 makes a first set of adjustments to LED display panel 100, or controller 132 determines the image to be displayed is, for example, a person or an animal, controller 132 makes a second set of adjustments to LED display panel 100 different from the adjustments made for the building image. It will be appreciated that the aforementioned images are merely exemplary and controller 132 may be configured to determine what image processing steps to perform based on any number of image characteristics. For example, controller 132 may be configured to distinguish between images that comprise natural scenes, environments and/or subjects (e.g., persons, trees, animals, etc.) and images that comprise man-made scenes and/or objects (e.g., buildings, cars, infrastructure, etc.) and may employ different image processing steps for the different types of images.

In various embodiments, controller 132 may also configured to adjust the brightness of LED display panel 100 based on an ambient level in in cabin 50. For example, controller 132 may receive a light level signal from a light sensor configured to detect a light level in cabin 50. Based on the light level signal, controller 132 may determine an intensity and/or power state for the various LEDs 102. For example, during overnight flights, or other times when cabin area is dark or a dark cabin area is desired, controller 132 may decrease the brightness of LED display panel 100. If there is bright ambient light in cabin 50 (e.g., the aircraft windows are open), controller 132 may increase a brightness of LED display panel 100.

Figure 4:
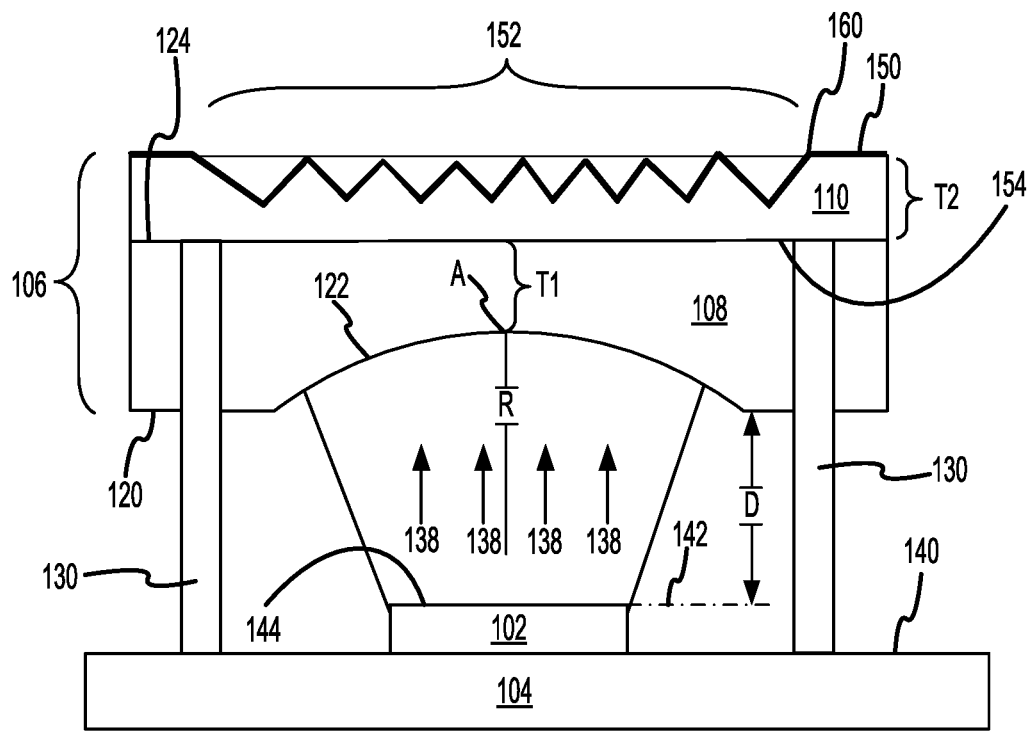
FIG. 4 illustrates an LED and optical assembly of a LED display panel, in accordance with various embodiments.

With reference to FIG. 4, additional details of an LED 102 and a portion of optical assembly 106 of LED display panel 100 are illustrated. In accordance with various embodiments, LED 102 is mounted to a surface 140 of substrate 104. LED 102 emits a light beam 138. Standoffs 130 may contact and/or be coupled to surface 140. Standoffs 130 maintain a distance D between inner surface 120 of lens array 108 and a plane 142. Plane 142 is coplanar with an upper surface 144 of LED 102. In various embodiments, a portion of standoffs 130 may be located in lens array 108. For example, a material of lens array 108 may be formed (e.g., molded) around standoffs 130. In various embodiments, standoffs 130 may extend to outer surface 124 of lens array 108. In various embodiments, standoffs 130 may terminate between inner surface 120 and outer surface 124 of lens array 108. In various embodiments, standoffs 130 may be bonded to inner surface 120 of lens array 108 (e.g., a length of standoffs 130 may be equal to the distance between surface 140 of substrate 104 and inner surface 120 of lens array 108).

Lens array 108 comprises a translucent material. In various embodiments, lens array 108 may be formed of polystyrene, polycarbonate acrylic, cyclic olefin copolymer, cyclic olefin polymer, polyetherimide, thermoplastic polyimide, or other suitably translucent lens material. The material of lens array 108 may be a Fire-Smoke-Toxicity compliant material and/or a material that complies with aircraft flammability regulations. Lens array 108 may be formed by injection molding, additive manufacturing (e.g., 3D printing), or any other suitable manufacturing process.

Inner curve 122 is formed having a radius of curvature R. In various embodiments, radius of curvature R may be between 0.5 millimeter (mm) and 20 mm, between 1 mm and 15 mm, between 1 mm and 10 mm, between 1 mm and 5 mm, or between 5 mm and 10 mm. With combined reference to FIG. 2B and FIG. 4, in various embodiments, the radius of curvature R of each of the inner curves 122 of lens array 108 may be equal to the radius of curvature R of all the other inner curves 122. In various embodiments, the radius of curvature R may vary between one or more of the inner curves 122 of lens array 108. For example, a radius of curvature R of first inner curve 122*a* may be different (e.g., greater than or less than) from the radius of curvature R of second inner curve 122*b* and/or different from the radius of curvature R of third inner curve 122*c*, and/or the radius of curvature R of second inner curve 122*b* may be different from the radius of curvature R of third inner curve 122*c*. The radius of curvature R of each inner curve 122 may be selected based on the wavelength of light emitted from the LED 102 associated with the inner curve 122 (e.g., based on the wavelength of light emitted from the LED 102 located directly under the inner curve 122).

In various embodiments, a thickness T1 (FIG. 4) of lens array 108 may be equal at each of the inner curves 122. Thickness T1 is measured between the apex A (FIG. 4) of the inner curve 122 and outer surface 124. Stated differently, thickness T1 is measured at the thinnest point between inner surface 120 and outer surface 124 for each inner curve 122. In various embodiments, thickness T1 may vary between one or more of the inner curves 122 of lens array 108. For example, a thickness T1 of first inner curve 122*a* may be different (e.g., greater than or less than) from the thickness T1 of second inner curve 122*b* and/or different from the thickness T1 of third inner curve 122*c*; and/or the thickness T1 of second inner curve 122*b* may be different from the thickness T1 of third inner curve 122*c*. The thickness T1 of each inner curve 122 may be selected based on the wavelength of light emitted from the LED 102 located directly under the inner curve 122.

With continued reference to FIG. 4, in various embodiments, diffuser 110 is coupled (e.g., bonded) to outer surface 124 of lens array 108. Diffuser 110 may comprise a semi-transparent or opaque material. Diffuser 110 may be formed of polystyrene, polycarbonate acrylic, cyclic olefin copolymer, cyclic olefin polymer, polyetherimide, thermoplastic polyimide, and/or any other material suitable for scattering light exiting outer surface 124 of lens array 108. In various embodiments, diffuser 110 may comprise a sheet or a tape adhesively bonded to outer surface 124.

In various embodiments, an outer (or first) surface 150 of diffuser 110 may be selectively patterned to scatter light exiting outer surface 124. Stated differently, a surface pattern 152 of peaks and valleys and angled surfaces may be formed in outer surface 150. Outer surface 150 is opposite (e.g., oriented away from) an inner (or second) surface 154 of diffuser 110. Inner surface 154 may contact and/or be directly bonded to outer surface 124 of lens array 108. In various embodiments, a surface coating 160 may be applied to outer surface 150 of diffuser 110. For example, surface coating 160 may be configured to further scatter, or diffuse, light exiting outer surface 150. In various embodiments, surface coating 160 may be configured to give outer surface 150 a matte finish or a glossy finish.

Figure 3:
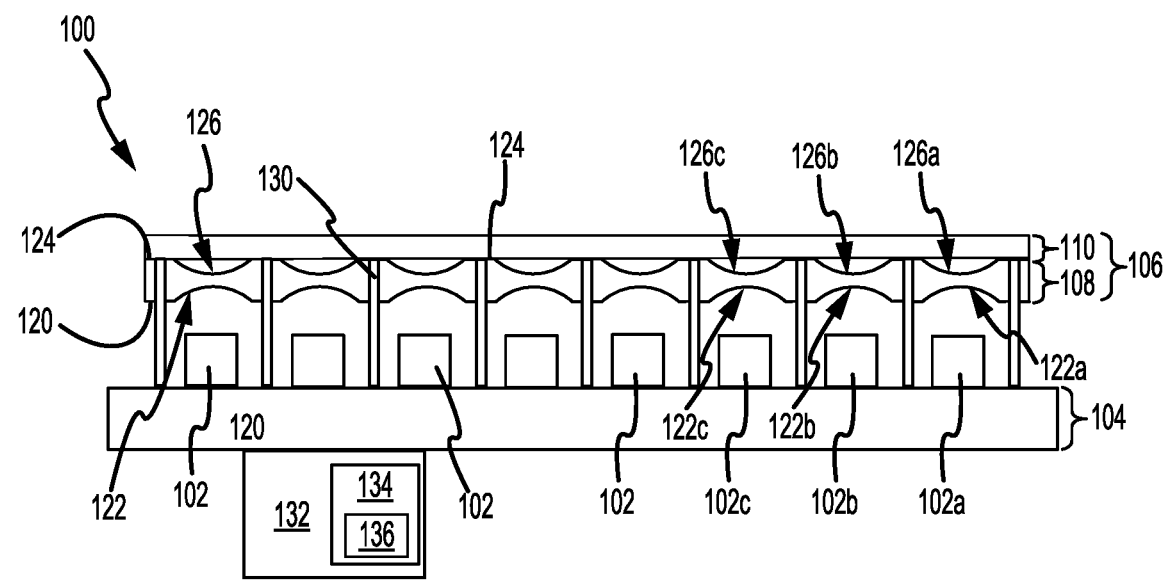
FIG. 3 illustrates a cross-section view of an LED display panel, wherein a lens array of the LED display panel includes both inner and outer curves, in accordance with various embodiments.

In various embodiments, the surface pattern 152 of outer surface 150, the material of diffuser 110, the surface coating 160, and/or a thickness T2 of diffuser 110 is/are selected based on the wavelength of the light emitted by LEDs 102 and/or based on the geometry of inner curves 122 and/or the geometry of outer curves 126 (FIG. 3). For example, the surface pattern 152 of outer surface 150, the material of diffuser 110, the surface coating 160, and/or a thickness T2 of diffuser 110 is/are selected based on radius of curvature R, thickness T1, and/or the material of lens array 108. Thickness T2 of diffuser 110 is measured between outer surface 150 and inner surface 154 of diffuser 110.

With combined reference to FIG. 2B and FIG. 4, in various embodiments, the transmission and/or scattering of light through a first region 110*a* of diffuser 110 may be different from the transmission and/or scattering of light through a second region 110*b* of diffuser 110 and/or different from the transmission and/or scattering of light through a third region 110*c* of diffuser 110. The transmission and/or scattering of light through second region 110*b* may different from the transmission and/or scattering of light through third region 110*c*. First region 110*a* may be located over first LED 102*a* and first inner curve 122*a*; second region 110*b* may be located over second LED 102*b* and second inner curve 122*b*; third region 110*c* may be located over third LED 102*c* and third inner curve 122*c*.

In various embodiments, the surface pattern 152 of outer surface 150 in first region 110*a*, the material of diffuser 110 in first region 110*a*, the surface coating 160 in first region 110*a*, and/or the thickness T2 of diffuser 110 in first region 110*a* may be different from the surface pattern 152 of outer surface 150 in second region 110*b*, the material of diffuser 110 in second region 110*b*, the surface coating 160 in second region 110*b*, and/or the thickness T2 of diffuser 110 in second region 110*b*. The surface pattern 152 of outer surface 150 in first region 110*a*, the material of diffuser 110 in first region 110*a*, the surface coating 160 in first region 110*a*, and/or the thickness T2 of diffuser 110 in first region 110*a* may be different from the surface pattern 152 of outer surface 150 in third region 110*c*, the material of diffuser 110 in third region 110*c*, the surface coating 160 in third region 110*c*, and/or the thickness T2 of diffuser 110 in third region 110*c*. The surface pattern 152 of outer surface 150 in second region 110*b*, the material of diffuser 110 in second region 110*b*, the surface coating 160 in second region 110*b*, and/or the thickness T2 of diffuser 110 in second region 110*b* may be different from the surface pattern 152 of outer surface 150 in third region 110*c*, the material of diffuser 110 in third region 110*c*, the surface coating 160 in third region 110*c*, and/or the thickness T2 of diffuser 110 in third region 110*c*.

Figure 5:
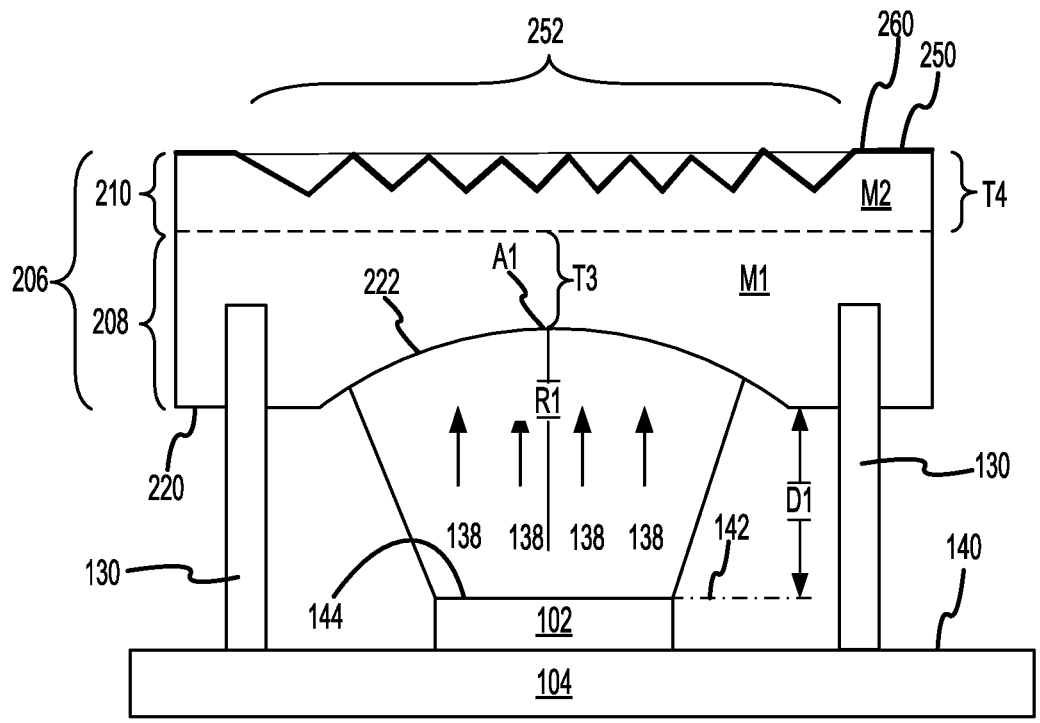
FIG. 5 illustrates an LED and optical assembly of a LED display panel, in accordance with various embodiments.

With reference to FIG. 5, an optical assembly 206 located over an LED 102 is illustrated. In various embodiments, LED display panel 100, with momentary reference to FIGS. 2A and 2B, may include optical assembly 206 in place of optical assembly 106. In this regard, elements with like element numbering, as depicted in FIG. 4, are intended to be the same and will not necessarily be repeated for the sake of brevity.

In accordance with various embodiments, optical assembly 206 includes a lens array (or lens array region) 208 and a diffuser (or diffusion region) 210. Stated differently, the diffuser 210 of optical assembly 206 is integrally formed with the lens array 208 of optical assembly 206. In this regard, lens array 208 and diffuser 210 are formed as a single structure, as opposed to two discrete structures that are then bonded together. For example, optical assembly 206 may be formed by injection molding, by additive manufacturing (e.g., 3D printing) or any other manufacturing process that allows for diffuser 210 to be integral with lens array 208. Standoffs 130 are coupled between substrate 104 and optical assembly 206. Standoffs 130 are configured to create and/or maintain distance D1 between inner surface 220 and plane 142. In various embodiments, a portion of standoffs 130 may be located in lens array 208. For example, a material of lens array 208 may be formed (e.g., molded) around standoffs 130.

In various embodiments, an inner surface 220 of lens array 208 defines a plurality of inner curves 222. Inner surface 220 is oriented toward substrate 104 and LEDs 102. In accordance with various embodiments, each LED 102 has a dedicated inner curve 222. Diffuser 210 is formed over lens array 208 such that lens array 208 is located between diffuser 210 and LEDs 102. Diffuser 210 is configured to distribute (e.g. scatter) the light exiting lens array 208.

In various embodiments, lens array 208 is formed of a first material M1. Material M1 may comprise a translucent material. In various embodiments, material M1 may be polystyrene, polycarbonate acrylic, cyclic olefin copolymer, cyclic olefin polymer, polyetherimide, thermoplastic polyimide, or other suitable translucent lens material.

Diffuser 210 is formed of a second material M2. Material M2 may comprise a semi-translucent or opaque material. In various embodiments, material M2 may be polystyrene, polycarbonate acrylic, cyclic olefin copolymer, cyclic olefin polymer, polyetherimide, thermoplastic polyimide, or other light scattering material. In various embodiments, material M2 is different from material M1. Materials M1, M2 of optical assembly 206 may be a Fire-Smoke-Toxicity compliant material and/or a material that complies with aircraft flammability regulations.

Inner curve 222 is formed having a radius of curvature R1. In various embodiments, radius of curvature R1 may be between 0.5 mm and 20 mm, between 1 mm and 15 mm, between 1 mm and 10 mm, between 1 mm and 5 mm, or between 5 mm and 10 mm. In various embodiments, the radius of curvature R1 of each of the inner curve 222 of lens array 208 may be equal to the radius of curvature R1 of all the other inner curves 222. In various embodiments, the radius of curvature R1 may vary between one or more of the inner curves 222 of lens array 208.

In various embodiments, a thickness T3 of lens array 208 (e.g., a thickness of material M1) may be equal at each of the inner curves 222. Thickness T3 is measured between the apex A1 of the inner curve 222 and the interface between material M1 and material M2. Stated differently, thickness T3 is measured at the thinnest point between inner surface 220 and material M2. In various embodiments, thickness T3 may vary between one or more of the inner curves 222 of lens array 208. The thickness T3 of each inner curve 222 may be selected based on the wavelength of light emitted from the LED 102 located directly under the inner curve 222.

Figure 6:
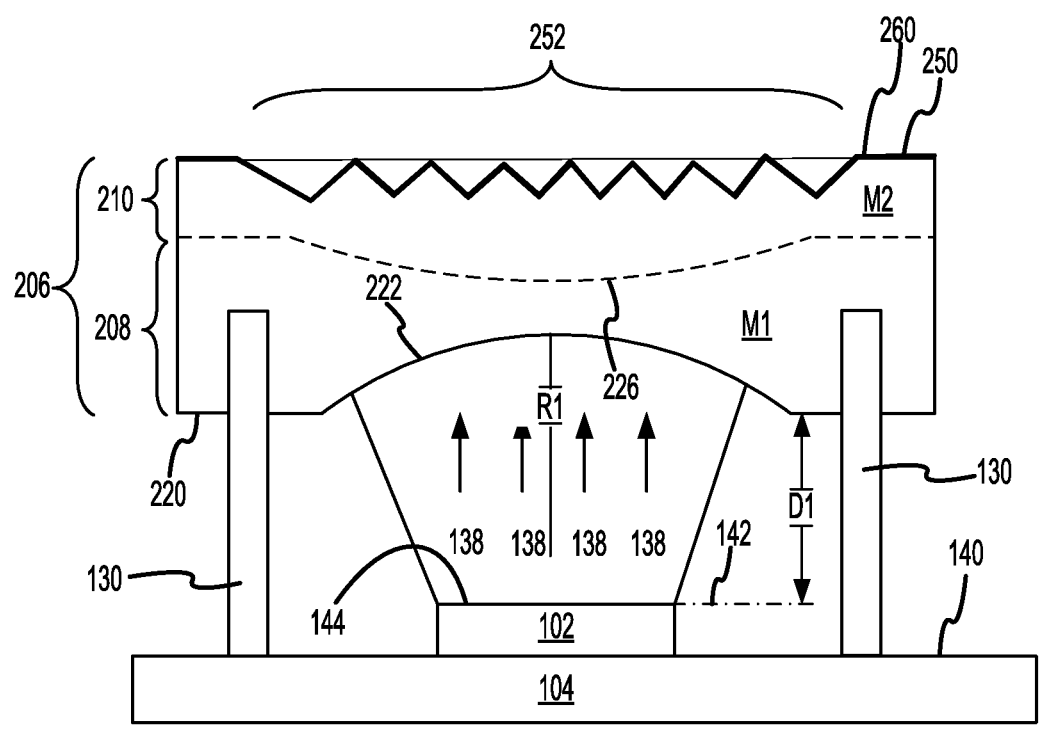
FIG. 6 illustrates an LED and optical assembly of a LED display panel, in accordance with various embodiments.

While lens array 208 is illustrated with a flat, plane at the transition between material M1 and material M2, in various embodiments, lens array 208 may include outer curves. For example, and with momentary reference to FIG. 6, in various embodiments, material M1 of lens array 208 defines a plurality of optically engineered outer curves 226. Outer curves 226 are designed (e.g., a shape, radius of curvature, focal length, etc. of each outer curve 226 is selected) based on desired characteristics (e.g., optical aberration, tilt, coma, distortion, etc.) for display panel 100. In this regard, the geometry of outer curves 226 is driven by the optical requirements of display panel 100.

In accordance with various embodiments, each LED 102 may have a dedicated outer curve 226. from the LED 102 located directly under each outer curve 226. In this regard, each LED 102 may have a dedicated inner curve 222 and a dedicated outer curve 226. In various embodiments, a geometry each of the outer curves 226 of lens array 208 may be the same the geometry of the other outer curves 226. In various embodiments, the curve geometry may vary between one or more of the outer curves 226. The geometry (e.g., a shape, radius of curvature, focal length, etc.) of each outer curve 226 may be the same or may be different from the geometry of the inner curve 222 located directly below the outer curve 226.

Returning to FIG. 5, In various embodiments, an outer surface 250 of diffuser 210 may be selectively patterned to scatter light. Stated differently, a surface pattern 252 of peaks and valleys and angled surfaces may be formed in outer surface 250. Outer surface 250 is opposite (e.g., oriented away from) inner surface 220. In various embodiments, a surface coating 260 may be applied to outer surface 250. For example, surface coating 260 may be configured to further scatter, or diffuse, light exiting outer surface 250. In various embodiments, surface coating 260 may be configured to give outer surface 250 a matte finish or a glossy finish.

In various embodiments, the surface pattern 252 of outer surface 250, the material M2 of diffuser 210, the surface coating 260, and/or a thickness T4 of diffuser 210 is/are selected based on the wavelength of the light emitted by LED 102 and/or based on the specifics of inner curve 222 (e.g., based on radius of curvature R1, thickness T3, and the material M1 of lens array 208). Thickness T4 is measured between outer surface 250 and the interface between material M1 and material M2. In various embodiments, the transmission of light may different between different regions of diffuser 210. For example, transmission of light through a first region of diffuser 210 may be different from the transmission of light through a second region of diffuser 210 and/or different from the transmission of light through a third region of diffuser 110. The first region may be located over first LED 102a (FIG. 2B) and a first inner curve 222; the second region may be located over second LED 102b (FIG. 2B) and a second inner curve 222; the third region may be located over third LED 102c (FIG. 2B) and a third inner curve 222.

In various embodiments, the surface pattern 252 of outer surface 250 in a first region of diffuser 210, the material M2 of diffuser 210 in the first region of diffuser 210, the surface coating 260 in the first region of diffuser 210, and/or the thickness T4 of diffuser 210 in the first region of diffuser 210 may be different from the surface pattern 252 of outer surface 250 in a second region of diffuser 210, the material M2 of diffuser 210 in the second region of diffuser 210, the surface coating 260 in the second region of diffuser 210, and/or the thickness T4 of diffuser 210 in the second region of diffuser 210.

In accordance with various embodiments, LED display panel 100 including optical assembly 106 or optical assembly 206 yields a thinner, lighter weight display panel with enhanced image quality and LED impact protection, as compared to current LED display panels, which do not include lens arrays and where the diffuser is supported by a separate mounting structure. In this regard, forming the optical assembly 106, 206 with the diffuser 110, 210 attached directly to the lens array 108, 208, and with optical assembly 106, 206 attached to the LED substrate 104 via standoffs 130 allows the distance between the LEDs 102 and the diffuser 110, 210 to be decreased. For example, LED display panel 100 including optical assembly 106 or optical assembly 206 may exhibit approximately a 37% reduction in thickness as compared to current LED display panels of similar pixel size and pitch. The decreased diffuser distance decreases an overall thickness of the LED display panel 100. Further eliminating the diffuser mount structure tends to simplify panel manufacturing and installation. A thinner, lighter weight panel allows the LED display panel 100 to be integrated throughout aircraft cabin 50.

Figure 7:
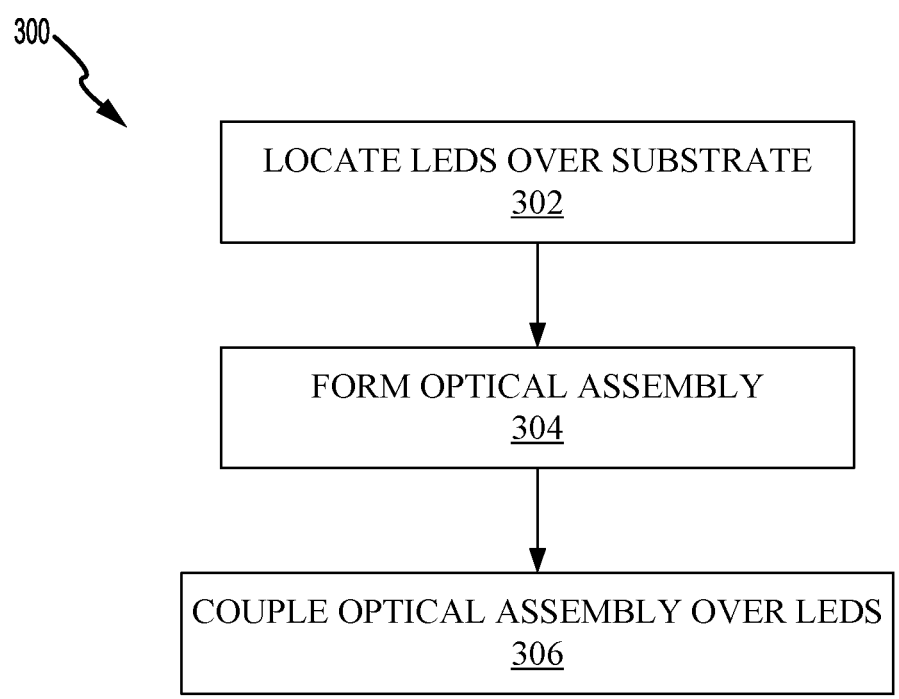
FIG. 7 illustrates a method of making a LED display panel, in accordance with various embodiments.

With reference to FIG. 7, a method 300 of making of a LED display panel is illustrated. In accordance with various embodiments, method may comprise locating a plurality of LEDs over a substrate (step 302), forming an optical assembly including a lens array and a diffuser (step 304), with lens array defining at one of a plurality of inner curves and/or a plurality of outer curves, and coupling the optical assembly over the plurality of LEDs (step 306).

In various embodiments, step 304 may include attaching the diffuser to a surface of the lens array. In various embodiments, step 304 may include forming the diffuser integrally with the lens array using injection molding. In various embodiments, step 304 may include forming the diffuser integrally with the lens array using additive manufacturing.

In various embodiments, step 304 may include forming a first inner curve of the plurality of inner curves having a first radius of curvature and a second inner curve of the plurality of inner curves having a second radius of curvature, with the second radius of curvature being different from the first radius of curvature.

In various embodiments, step 304 may include forming a first inner curve of the plurality of inner curves having a first geometry and a second inner curve of the plurality of inner curves having a second geometry, where the second geometry is different from the first geometry. The first inner curve is located over a first LED of the plurality of LEDs, and the second inner curve is located over a second LED of the plurality of LEDs.

In various embodiments, step 304 may include forming a first outer curve of the plurality of inner curves having a third geometry and a second outer curve of the plurality of inner curves having a fourth geometry, where he third geometry is different from the fourth geometry. The first outer curve is located over the first LED of the plurality of LEDs. The second outer curve is located over the second LED of the plurality of LEDs.

In various embodiments, step 304 may include forming a first surface pattern in a first region of the diffuser and forming a second surface pattern, different from the first surface pattern, in a second region of the diffuser. In various embodiments, step 304 may include forming a first region of the diffuser using a first material and forming a second region of the diffuser using a second material different from the first material. In various embodiments, step 304 may include applying a first surface coating over a first region of the diffuser and applying a second surface coating, different from the first surface coating, over a second region of the diffuser. In various embodiments, step 304 may include forming a first region of the diffuser having a first thickness and forming a second region of the diffuser having a second thickness greater than the first thickness.

In various embodiment, step 306 may include locating a plurality of standoffs between the lens array and the substrate. In various embodiments, the plurality of standoffs may be coupled to the substrate.

In various embodiments, step 304 may include determining a design, or configuration, for the optical assembly based on an image quality assessment. With combined reference to FIG. 7 and FIGS. 3 and 4, in various embodiments, the design/configuration of optical assembly 106 may be determined based on image quality assessments. For example, a variety of combinations of different shaped inner curves 122, different shaped outer curve 126, and different materials, surface patterns, thickness, etc. for diffuser 110 may be evaluated using subjective image quality assessments and/or objective image quality assessments. In various embodiments, the objective image quality assessments may include comparing an image displayed on LED display panel 100 to a target image and evaluating the displayed image using various quality assessment metrics including one or more of PSNR, MSE, or SSIM. In various embodiments, controller 132 may perform image processing to improve how the image appears on LED display panel 100 and/or to increase in the image quality assessment score. In this regard, the particular design configuration of optical assembly 106 (e.g., of lens array 108 and diffuser 110) may be selected in response to determining, based on subjective and objective image quality assessments, which configuration of optical assembly 106 produces high quality images.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Different cross-hatching is used throughout the figures to denote different parts but not necessarily to denote the same or different materials.

Systems, methods, and apparatus are provided herein. In the detailed description herein, references to "one embodiment," "an embodiment," "various embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Numbers, percentages, or other values stated herein are intended to include that value, and also other values that are about or approximately equal to the stated value, as would be appreciated by one of ordinary skill in the art encompassed by various embodiments of the present disclosure. A stated value should therefore be interpreted broadly enough to encompass values that are at least close enough to the stated value to perform a desired function or achieve a desired result. The stated values include at least the variation to be expected in a suitable industrial process, and may include values that are within 10%, within 5%, within 1%, within 0.1%, or within 0.01% of a stated value. Additionally, the terms "substantially," "about" or "approximately" as used herein represent an amount close to the stated amount that still performs a desired function or achieves a desired result. For example, the term "substantially," "about" or "approximately" may refer to an amount that is within 10% of, within 5% of, within 1% of, within 0.1% of, and within 0.01% of a stated amount or value.

In various embodiments, system program instructions or controller instructions may be loaded onto a tangible, non-transitory, computer-readable medium (also referred to herein as a tangible, non-transitory, memory) having instructions stored thereon that, in response to execution by the controller, cause the controller to perform various operations.

The term "non-transitory" is to be understood to remove only propagating transitory signals per se from the claim scope and does not relinquish rights to all standard computer-readable media that are not only propagating transitory signals per se. Stated another way, the meaning of the term "non-transitory computer-readable medium" and "non-transitory computer-readable storage medium" should be construed to exclude only those types of transitory computer-readable media that were found by In Re Nuijten to fall outside the scope of patentable subject matter under 35 U.S.C. § 101.

Furthermore, no element, component, or method step in the present disclosure is intended to be dedicated to the public regardless of whether the element, component, or method step is explicitly recited in the claims. No claim element herein is to invoke 35 U.S.C. 112(f) unless the element is expressly recited using the phrase "means for." As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

Finally, it should be understood that any of the above described concepts can be used alone or in combination with any or all of the other above described concepts. Although various embodiments have been disclosed and described, one of ordinary skill in this art would recognize that certain modifications would come within the scope of this disclosure. Accordingly, the description is not intended to be exhaustive or to limit the principles described or illustrated herein to any precise form. Many modifications and variations are possible in light of the above teaching.

What is claimed:

1. A method of making of light emitting diode display panel, comprising:
   locating a plurality of light emitting diodes over a substrate;
   forming an optical assembly including a lens array and a diffuser, wherein the lens array defines at least one of a plurality of inner curves or a plurality of outer curves, wherein forming the optical assembly comprises:
      forming a first region of the diffuser comprising a least one of a first surface pattern, a first material, a first thickness, or a first surface coating, and forming a second region of the diffuser comprising at least one of a second surface pattern, a second material, a second thickness, or a second surface coating, the first surface pattern being different from the second surface pattern, the second material being different from the first material, the second thickness being different from the first thickness, the second surface coating being different from the first surface coating, wherein the first region of the diffuser is located over the first light emitting diode of the plurality of light emitting diodes, and wherein the second region of the diffuser is located over the second light emitting diode of the plurality of light emitting diodes; and
   coupling the optical assembly over the plurality of light emitting diodes.

2. The method of claim 1, wherein forming the optical assembly comprises determining a design of the lens array and the diffuser based on an image quality assessment.

3. The method of claim 1, wherein forming the optical assembly comprises forming the diffuser integrally with the lens array using at least one of injection molding or additive manufacturing.

4. The method of claim 1, wherein coupling the optical assembly over the plurality of light emitting diodes comprises locating a plurality of standoffs between the lens array and the substrate.

5. The method of claim 4, wherein forming the optical assembly further comprises at least one of:
   forming a first inner curve of the plurality of inner curves having a first geometry and a second inner curve of the plurality of inner curves having a second geometry, the second geometry being different from the first geometry, wherein the first inner curve is located over a first light emitting diode of the plurality of light emitting diodes, and wherein the second inner curve is located over a second light emitting diode of the plurality of light emitting diodes; or
   forming a first outer curve of the plurality of inner curves having a third geometry and a second outer curve of the plurality of inner curves having a fourth geometry, the third geometry being different from the fourth geometry, wherein the first outer curve is located over the first light emitting diode of the plurality of light emitting diodes, and wherein the second outer curve is located over the second light emitting diode of the plurality of light emitting diodes.

6. An aircraft cabin structure, comprising:
   a surface; and
   a light emitting diode display panel mounted to the surface, the light emitting diode display panel including:
      a substrate;
      a plurality of light emitting diodes located over the substrate; and
      an optical assembly located over the plurality of light emitting diodes, the optical assembly including a lens array and a diffuser, wherein at least one of a first surface pattern of a first region of the diffuser, a first thickness of the first region of the diffuser, a first surface coating of the first region of the diffuser, or a first material of the first region of the diffuser is different from at least one of a second surface pattern of a second region of the diffuser, a second thickness of the second region of the diffuser, a second surface coating of the second region of the diffuser, or a second material of the second region of the diffuser.

7. The aircraft cabin structure of claim 6, wherein an inner surface of the lens array defines a plurality of inner curves, and wherein an outer surface of the lens array defines a plurality of outer curves.

8. The aircraft cabin structure of claim 7, further comprising a plurality of standoffs coupled between the substrate and the lens array.

9. A light emitting diode display panel, comprising:
   a substrate;
   a plurality of light emitting diodes located over the substrate; and an optical assembly located over the plurality of light emitting diodes, the optical assembly including a lens array and a diffuser, wherein at least one of a first surface pattern of a first region of the diffuser, a first thickness of the first region of the diffuser, a first surface coating of the first region of the diffuser, or a first material of the first region of the diffuser is different from at least one of a second surface pattern of a second region of the diffuser, a second thickness of the second region of the diffuser, a second surface coating of the second region of the diffuser, or a second material of the second region of the diffuser.

10. The light emitting diode display panel of claim 9, wherein an inner surface of the lens array defines a plurality of inner curves.

11. The light emitting diode display panel of claim 10, wherein a geometry of a first inner curve of the plurality of inner curves is different from a geometry of a second inner curve of the plurality of inner curves, and wherein the first inner curve is located over a first light emitting diode of the plurality of light emitting diodes and the second inner curve is located over a second light emitting diode of the plurality of light emitting diodes.

12. The light emitting diode display panel of claim 10, wherein each inner curve of the plurality of inner curves includes a dedicated inner curve of the plurality of inner curves.

13. The light emitting diode display panel of claim 12, wherein an outer surface of the lens array defines a plurality of outer curves.

14. The light emitting diode display panel of claim 13, wherein each light emitting diode of the plurality of light emitting diodes includes a dedicated outer curve of the plurality of outer curves.

15. The light emitting diode display panel of claim 10, further comprising a plurality of standoffs coupled between the substrate and the lens array.

16. The light emitting diode display panel of claim 9, wherein the diffuser is integral to the lens array.

17. The light emitting diode display panel of claim 9, wherein the first region of the diffuser is located over a first light emitting diode of the plurality of light emitting diodes and the second region of the diffuser is located over a second light emitting diode of the plurality of light emitting diodes, and wherein the first light emitting diode emits light having a first wavelength and the second light emitting diode emits light having a second wavelength different from the first wavelength.

18. The light emitting diode display panel of claim 9, further comprising a controller operably coupled to the plurality of light emitting diodes, the controller being configured to perform an image quality assessment for a displayed image.

19. The light emitting diode display panel of claim 18, wherein the controller is configured to compare the displayed image to a target image, and adjust at least one of a sharpness, a contrast, or a brightness of the of the light emitting diode display panel based on the comparison of the displayed image to the target image.

* * * * *